United States Patent
Anand et al.

(10) Patent No.: US 7,315,193 B2
(45) Date of Patent: Jan. 1, 2008

(54) CIRCUITRY AND METHOD FOR PROGRAMMING AN ELECTRICALLY PROGRAMMABLE FUSE

(75) Inventors: Darren L. Anand, Essex Junction, VT (US); Larry Wissel, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 11/161,966

(22) Filed: Aug. 24, 2005

(65) Prior Publication Data

US 2007/0046361 A1    Mar. 1, 2007

(51) Int. Cl.
*H01H 37/76* (2006.01)
(52) U.S. Cl. .......................... 327/525; 326/38
(58) Field of Classification Search ............... 327/525
See application file for complete search history.

(56) References Cited

U.S. PATENT DOCUMENTS

| | | | |
|---|---|---|---|
| 4,730,129 A | 3/1988 | Kunitoki et al. | |
| 5,420,456 A | 5/1995 | Galbi et al. | 257/529 |
| 5,882,998 A | 3/1999 | Sur, Jr. et al. | 438/601 |
| 6,130,469 A | 10/2000 | Bracchitta et al. | 257/530 |
| 6,574,145 B2 * | 6/2003 | Kleveland et al. | 365/185.19 |
| 6,624,499 B2 | 9/2003 | Kothandaraman et al. | 257/529 |
| 6,781,436 B2 * | 8/2004 | Kothandaraman et al. | 327/525 |
| 6,882,214 B2 * | 4/2005 | Spenea et al. | 327/525 |
| 2004/0004268 A1 | 1/2004 | Brown et al. | 257/529 |
| 2005/0122159 A1 * | 6/2005 | Kim et al. | 327/525 |
| 2006/0273841 A1 * | 12/2006 | Hanson et al. | 327/525 |

* cited by examiner

*Primary Examiner*—Kenneth B. Wells
*Assistant Examiner*—Terry L. Englund
(74) *Attorney, Agent, or Firm*—Downs Rachlin Martin PLLC

(57) ABSTRACT

Circuitry that includes a voltage controller (224) for providing a variable gate signal (220) for controlling the gate of a programming transistor (212) used in conjunction with programming an electrically programmable fuse ("eFuse") (204) of an integrated circuit (200). The voltage controller adjusts the gate signal depending upon whether the circuitry is in an eFuse programming mode or an eFuse resistance measuring mode. The voltage controller may optionally include a voltage tuner (252) for tuning the gate signal to account for operating variations in the programming transistor caused by manufacturing variations.

8 Claims, 2 Drawing Sheets

CIRCUITRY AND METHOD FOR PROGRAMMING AN ELECTRICALLY PROGRAMMABLE FUSE

FIELD OF THE INVENTION

The present invention generally relates to the field of integrated circuits. In particular, the present invention is directed to circuitry and a method for programming an electrically programmable fuse.

BACKGROUND OF THE INVENTION

FIGS. 1A and 1B illustrate conventional electrically programmable fuse ("eFuse") circuitry 10 during, respectively, programming of the eFuse 20 and measuring of the resistance of the eFuse to determine its programmed state. To facilitate programming eFuse 20, i.e., "blowing" the eFuse so as to change its electrical resistance, circuitry 10 includes a programming transistor 30 that switches on and off a relatively high-energy (voltage and current) programming signal from a suitable power source 40 in response to an appropriate gate control signal 50 (FIG. 1A). When programming transistor 30 is on, it allows the programming energy to flow through eFuse 20, thereby causing the resistance of the eFuse to change. During programming, power source 40 is usually at a voltage level of, e.g., 3.3V, with a current on the order of, e.g., 12 mA for a 130 nm technology.

Besides blowing eFuse 20, another use of circuitry 10 is to make analog measurements of the resistance of the eFuse before and after it is blown. Measuring the resistance of eFuse 20 before and after blowing are important characterization tools used to ensure that the desired programming of the eFuse is achieved. To make pre-blow measurements possible, the voltage of power source 40 has to be relatively low, such as 0.1V (FIG. 1B), so that the electrical energy available to eFuse 20 during measuring does not blow the eFuse.

In order to withstand the relatively high voltage of power supply 40, during programming, programming transistor 30 must be a long-channel, thick-oxide transistor (e.g., gate length=240 nm, gate oxide thickness=5.2 nm in 130 nm technology). Such large transistors are integrated into various technologies for use in high-voltage settings, such as 2.5V and 3.3V interfaces, and, therefore, are readily available. However, the threshold voltage of these large transistors is moderately high (e.g., 0.6V), so that when the logic "1" level of gate control signal 50 provided to programming transistor 30 is from a conventional, low-voltage supply (e.g., Vdd=1.2V), the "overdrive," which is equal to voltage of gate control signal, Vg=1.2V, minus the threshold voltage of the transistor, Vt=0.6V, is not large. This requires programming transistor 30 to be physically very large to achieve the desired current.

Another unfavorable situation happens when the overdrive varies significantly as the threshold voltage varies with normal processing variation around a range between 0.5V and 0.7V. In the context of circuitry 10, this type of variation results in uncertainty in the programming current as the voltage threshold of programming transistor 30 varies. Therefore, programming can be unreliable. Too little current will not be able to program eFuse 20, and too much current will rupture the eFuse. Thus, neither case provides a desirable programming mode. It would be desirable to have the ability to "tune" the logic "1" level to ensure a suitable programming current.

A higher voltage, e.g., a voltage in a 2.0V-3.3V range, is required for the "1" level of the gate control signal 50 to enable the size of programming transistor 30 to be reduced, and also to reduce the uncertainty in the overdrive. In this case, programming transistor 30 would be sized for the actual value of the logic "1" level. For each of 2.5V and 3.3V, unique designs would be required when those voltage levels are available. However, not all integrated circuit chips require a separate high-voltage supply for any reason besides eFuse programming. Providing extra power supplies and extra package pins is expensive, at least from a design point of view and is, therefore, desirable to avoid.

Power source 40 takes on a high voltage during programming and, therefore, would be suitable as a source for gate control signal 50 of the programming transistor 30 during blowing of eFuse 20. However, power source 40 would not be suitable as a source for gate control signal 50 during the resistance measurement because the voltage of the power source is so low during the resistance measurement (e.g., 0.1V) that programming transistor 30 would not conduct at all. Accordingly, there is a need for a means to make high gate control signal 50 a voltage sufficient to blow eFuse 20, but to still enable the resistance measurement without providing an additional high-voltage supply.

SUMMARY OF THE INVENTION

In one aspect, the present invention is directed to an integrated circuit comprising an electrically programmable fuse and a programming transistor located in electrical series with the electrically programmable fuse, the programming transistor includes a gate responsive to a gate control signal. A voltage controller is in electrical communication with the gate and operatively configured to select one of a plurality of input signals and generate the gate control signal as a function of the one of the plurality of input signals.

In another aspect, the present invention is directed to a method of controlling a current flowing through an electrically programmable fuse comprising selecting within integrated circuitry one of a first voltage signal and a second voltage signal. A gate control signal is provided to a gate of a programming transistor. The gate control signal is a function of the one of the first voltage signal and the second voltage signal selected.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION OF THE DRAWINGS

Figure 1A:
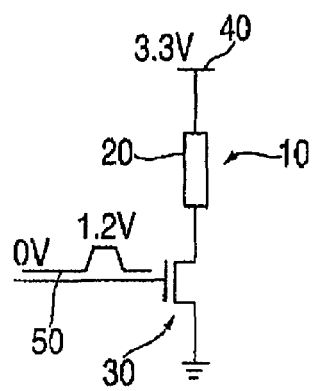
FIGS. 1A and 1B are schematic diagrams of conventional electrically programmable fuse circuitry illustrating, respectively, the circuitry in a programming mode and a resistance measurement mode.
Figure 1B:
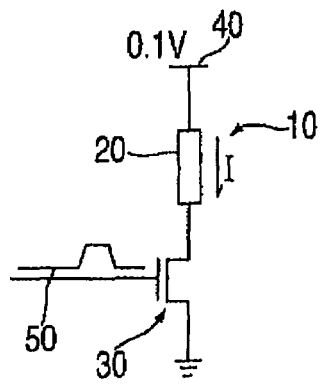

The present invention includes novel circuitry and methods for programming an electrically programmable fuse ("eFuse"). As discussed below, one embodiment of the circuitry utilizes a programming transistor, which is similar to programming transistor of FIGS. 1A and 1B, to control the flow of a relatively high energy programming signal to the eFuse. The programming transistor is responsive to a gate control signal. A novel aspect of the circuitry of the present invention is that it includes a voltage controller that varies the gate control signal of the programming transistor as a function of the signal being provided to the eFuse. For example, in a programming mode when a relatively high-energy programming signal is applied to the eFuse, the voltage controller provides a relatively high-voltage gate control signal, e.g., on the order of 3.3V in one example. In contrast, during an eFuse resistance measuring mode when a relatively low-energy signal is applied to the eFuse, the voltage controller provides a relatively low-voltage gate control signal, e.g., on the order of 1.2V in the example. A voltage controller of the present invention may optionally be provided with a voltage tuner that allows the voltage level of the gate control signal to be tuned to account for variability in the operating characteristics, e.g., overdrive, of the programming transistor due to manufacturing variations. Examples of circuitry that may be used to implement a voltage controller of the present invention are described below.

Figure 2:
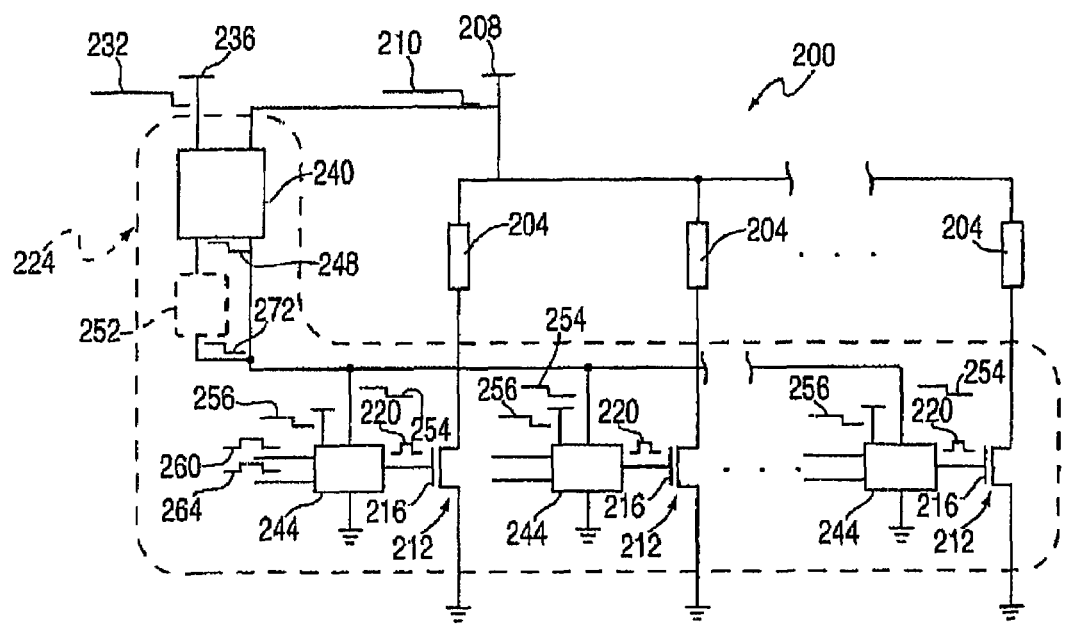
FIG. 2 is a high-level schematic diagram of an integrated circuit of the present invention that includes a voltage controller that varies the voltage provided to the gate of an eFuse programming transistor.

Referring to the drawings, FIG. 2 shows in accordance with the present invention an integrated circuit (IC), which is generally indicated by the numeral 200. IC 200 may include a plurality of eFuses 204 of a conventional type. Generally, each eFuse 204 is capable of having its resistance changed so as to program the eFuse by energizing that eFuse with an amount of energy within a predetermined range, e.g., by inducing an electrical current of a predetermined magnitude to flow within the eFuse. Since eFuses 204 may be any suitable eFuses known in the art, it is not necessary to describe eFuses in any detail. Those skilled in the art will readily understand how to design eFuses 204 and determine the acceptable range of programming energy needed to properly program the eFuses.

EFuses 204 may each be in electrical communication with a common voltage signal source 208, that may provide a first signal 210 that may be either of a programming signal, i.e., a signal having a sufficient energy to program eFuses 204, and a resistance measuring signal, i.e., a signal used to measure the resistance of an eFuse and having an energy sufficiently low so as to inhibit "blowing," or programming, the eFuse, depending on the mode of operation. Voltage signal source 208 may be powered by any conventional power supply, e.g., a variable power supply (not shown) aboard the chip (not shown) of which IC 200 is part, or, alternatively, one or more external power supplies that communicate with voltage signal source 208 via an external link, such as a package pin (not shown).

Each eFuse 204 may have a corresponding respective programming transistor 212 located in electrical series with that eFuse. Like programming transistor 30 of FIGS. 1A and 1B, each programming transistor 212 serves as a switch during programming and resistance measuring modes of the respective eFuse 204. During programming, programming transistor 212 of a corresponding eFuse 204 being programmed is switched on so as to allow the programming signal, i.e., first signal 210, to flow through that eFuse. During resistance measuring, the programming transistor 212 of an eFuse 204 having its resistance measured is switched on so as to allow the resistance measuring signal, i.e., first signal 210, to flow through the eFuse. Each programming transistor 212 includes a gate 216 that controls the on-off state of that transistor and is responsive to a gate control signal 220.

IC 200 further includes a voltage controller 224 that may have as inputs a plurality of input signals, such as first signal 210 from voltage signal source 208 and a second signal 232 different from the first signal. Second signal 232 may be, e.g., a Vdd signal, i.e., a chip-level normal operating voltage signal, or other signal as appropriate, that may be provided by a voltage signal source 236. As discussed below in detail, voltage controller 224 generally enables selection of one of the input voltage signals, in this case either first signal 210 or second signal 232, and generates an appropriate level for gate signal 220 as a function of the signal selected.

In order to achieve this functionality, voltage controller 224 may include a voltage selector 240 and a plurality of programming controllers 244, wherein each programming controller corresponds to a respective programming transistor 212. Generally, voltage selector 240 provides selectability between first and second signals 210, 232 and may output a selector signal 248 to each programming controller 244 or, optionally, to a voltage tuner, such as voltage tuner 252. Although voltage selector 240 may comprise any circuitry suitable for selecting between/among a plurality of input signals and outputting selector signal 248 as a function of the selected input signal, FIG. 3A illustrates exemplary voltage selector circuitry 300 suitable for use in voltage selector 240 of FIG. 2.

Figure 3A:
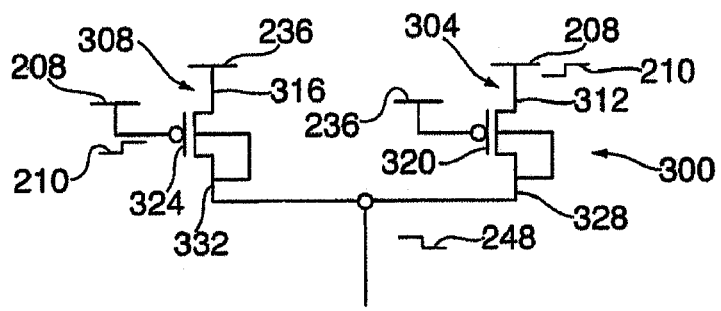
FIG. 3A is a schematic diagram of voltage selector circuitry suitable for use in the voltage selector of FIG. 2.

As shown in FIG. 3A, voltage selector circuitry 300 may include first and second p-channel transistors 304, 308 each having one of its terminals 312, 316 electrically connected to a corresponding respective one of voltage signal sources 208, 236, and its gate 320, 324 electrically connected to the other one of voltage signal sources 208, 236. The other terminals 328, 332 of transistors 304, 308 are electrically coupled together. With this configuration, e.g., when first signal 210 of voltage source 208 is 3.3V (i.e., during programming), selector signal 248 output by voltage selector circuitry 300 will be equal to about 3.3V. This is so because transistor 308 is off and transistor 304 is on, pulling the common N-well of the two transistors to 3.3V. On the other hand, when first signal 210 of voltage source 208 is, e.g., 0.1V (i.e., during analog resistance measuring), selector signal 248 will be about 1.2V. This is so because transistor 304 is off and transistor 308 is on, thereby pulling selector signal 248 to 1.2V.

Figure 3B:
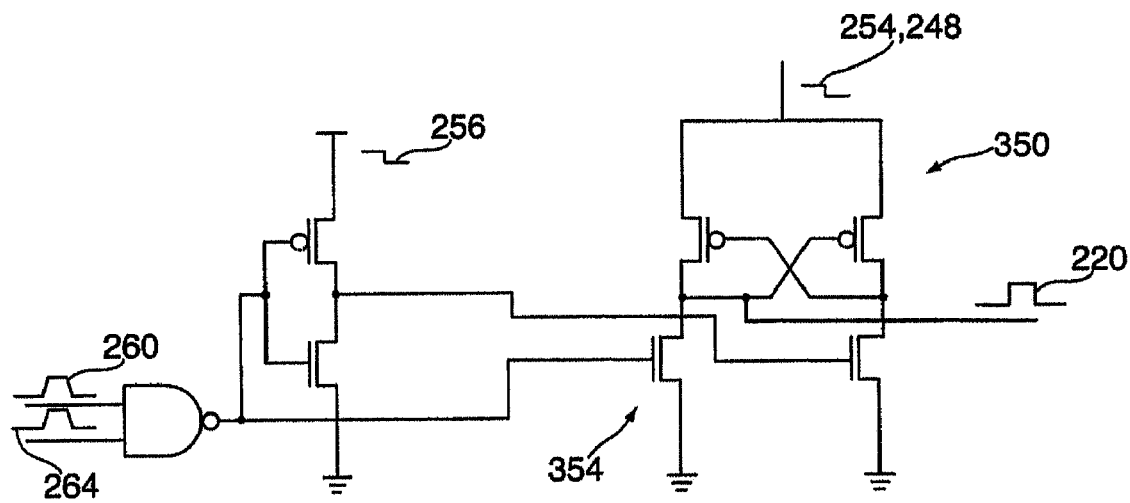
FIG. 3B is a schematic diagram of a programming controller circuitry suitable for use in the programming controller of FIG. 2.

Referring again to FIG. 2, if voltage tuner 252 is not present, selector signal 248 from voltage selector 240 may be input directly into each programming controller 244 as input signal 254. As discussed below, other inputs to programming controller 244 may include a standard voltage signal 256, e.g., a Vdd signal, a programming signal 260, and a selection signal 264. Each programming controller 244 of FIG. 2 may include the programming controller circuitry 350 shown in FIG. 3B. Programming controller circuitry 350 may include level-translation circuitry 354 of a type well known in the art of IC input/output design. Generally, however, programming and selection signals 260, 264 are logic signals with an up-level equal to voltage signal 256. When both programming and selection signals 260, 264 are high, i.e., logic "1," the output of programming controller circuitry 350, i.e., gate signal 220, will take the level of input signal 254, in this case selector signal 248. Otherwise, gate signal 220 will be ground. The voltage level of input signal 254 will appear on gate control signal 220, turning on programming transistor 212, either during eFuse programming or during resistance measuring.

Figure 3C:
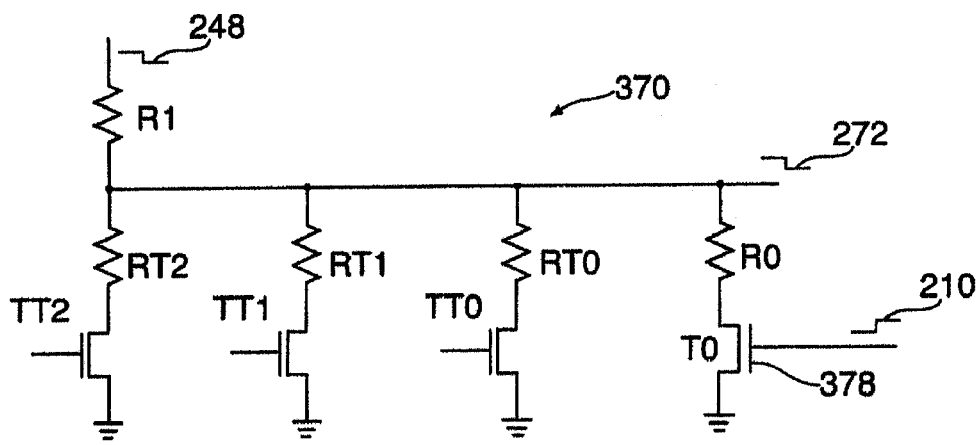
FIG. 3C is a schematic diagram of a voltage tuner circuitry suitable for use in the voltage tuner of FIG. 2.

If, on the other hand, voltage tuner 252 (FIG. 2) is present in voltage controller 224, selector signal 248 output by voltage selector 240 may be input into the voltage tuner, which as mentioned above allows the selector signal to be tuned to account for variation in the overdrive voltage of programming transistor 212. In this case, voltage tuner 252 may tune selector signal 248 so as to produce a tuned signal 272 intended to ensure that gate signal 220 is of the correct value to enable 12 mA to flow through programming transistor 212. FIG. 3C illustrates voltage tuner circuitry 370 suitable for use as voltage tuner 252 of FIG. 2.

As shown in FIG. 3C, voltage tuner circuitry 370 may include a plurality of resistors R0, R1 and a plurality of tuning resistors RT0-RT2 arranged as shown. Each tuning resistor RT0-RT2 may have a corresponding respective tuning transistor TT0-TT2 for switching that tuning resistor on or off as desired so as to change the input, i.e., selector signal 248, to an output, i.e., tuned signal 272, having a desired voltage level. Each tuning transistor TT0-TT2 may be controlled by a corresponding respective control bit. The values of the control bits would typically be determined after determining the amount of adjustment to selector signal 248 needed as a function of the impact of processing variations.

Resistors R0, R1 that are not affected by tuning resistors RT0-RT2, result in the voltage of tuned signal 272 being less than the voltage of selector signal 248 during eFuse programming. This is desirable so as to cause programming transistor 212 (FIG. 2) to remain in saturation as long as possible, which is desirable for correct programming. The resistance values of resistors R0, R1 and RT0-RT2 may be selected so as to select a value of tuned signal 272 well above the threshold of programming transistor 212 (FIG. 2), but low enough to operate the programming transistor in the saturation region during eFuse programming. A exemplary value of the voltage of tuned signal 272 is 2V for 130 nm technology.

In the exemplary embodiment shown in FIG. 3C, voltage tuning circuitry 370 contains three tuning resistors RT0-RT2. This provides eight different voltage levels for tuned signal 272. Of course, other embodiments may have more or fewer tuning resistors as appropriate for a particular design. Voltage tuning circuitry may also include a switch transistor T0 having its gate 378 controlled by first signal 210. Transistor T0 will be off during resistance measurement because first signal 210 is only about 0.1V during resistance measurement. This is required because selector signal 248 is only about 1.2V during resistance measurement, and if tuned signal 272 were attenuated further, then programming transistor 212 (FIG. 2) would not turn on adequately to allow resistance measurement.

Although the invention has been described and illustrated with respect to exemplary embodiments thereof, it should be understood by those skilled in the art that the foregoing and various other changes, omissions and additions may be made therein and thereto, without parting from the spirit and scope of the present invention.

What is claimed is:

1. An integrated circuit, comprising:
   an electrically programmable fuse;
   a programming transistor located in electrical series with said electrically programmable fuse, said programming transistor including a gate responsive to a gate control signal;
   a first source operatively configured to provide a programming signal to said electrically programmable fuse;
   a second source operatively configured to provide a chip operating voltage signal;
   a voltage controller in electrical communication with said gate and each of said first source and said second source, said voltage controller operatively configured to select one of said programming signal and said chip operating voltage signal and to generate said gate control signal as a function of said one of said programming signal and said chip operating voltage signal.

2. An integrated circuit according to claim 1, wherein said voltage controller comprises a voltage tuner for tuning said gate control signal.

3. An integrated circuit according to claim 1, wherein said voltage controller comprises:
   (a) a programming controller in electrical communication with said electrically programmable fuse; and
   (b) voltage tuning circuitry for:
      (i) receiving said one of said programming signal and said chip operating voltage signal;
      (ii) tuning said one of said programming signal and said chip operating voltage signal so as to obtain a tuned signal; and
      (iii) providing said tuned signal to said programming controller as said gate control signal.

4. An integrated circuit according to claim 1, wherein said voltage controller is shared by a plurality of electronically programmable fuses.

5. An integrated circuit, comprising:
   a plurality of voltage signal sources configured to provide a corresponding respective plurality of input signals;
   an electrically programmable fuse in electrical communication with one of said plurality of voltage sources;
   a programming transistor located in electrical series with said electrically programmable fuse and including a gate responsive to a gate control signal;
   a voltage controller in electrical communication with said gate and comprising:
      (i) a voltage signal selector operatively configured to select one of said plurality of input signals; and
      (ii) a programming controller operatively configured to output said gate control signal as a function of said one of said plurality of input signals and a programming signal; and
   a voltage tuner electrically coupled between said voltage signal selector and said programming controller, said voltage tuner circuitry for tuning said gate control signal.

6. An integrated circuit according to claim 5, wherein one of said plurality of voltage signal sources is a Vdd voltage source and another of said plurality of voltage signal sources is said one of said plurality of voltage signal sources in electrical communication with said electrically programmable fuse.

7. An integrated circuit, comprising:
   an electrically programmable fuse;
   a programming transistor located in electrical series with said electrically programmable fuse, said programming transistor including a gate responsive to a gate control signal;
   a voltage controller in electrical communication with said gate and operatively configured to select one of a plurality of input signals and generate said gate control signal as a function of said one of said plurality of input signals, said voltage controller comprising:
      (a) a programming controller in electrical communication with said electrically programmable fuse; and
      (b) voltage tuning circuitry for:
         (i) tuning said gate control signal; and
         (ii) following said tuning, providing said gate control signal to said programming controller.

8. An integrated circuit according to claim 7, wherein said voltage controller is shared by a plurality of electronically programmable fuses.

* * * * *